(12) United States Patent
Ahn

(10) Patent No.: US 8,710,503 B2
(45) Date of Patent: Apr. 29, 2014

(54) ORGANIC LIGHT-EMITTING DISPLAY AND METHOD OF MANUFACTURING THE SAME

(75) Inventor: Tae-Kyung Ahn, Yongin (KR)

(73) Assignee: Samsung Display Co., Ltd. (KR)

( * ) Notice: Subject to any disclaimer, the term of this patent is extended or adjusted under 35 U.S.C. 154(b) by 626 days.

(21) Appl. No.: 12/944,619

(22) Filed: Nov. 11, 2010

(65) Prior Publication Data

US 2011/0140115 A1   Jun. 16, 2011

(30) Foreign Application Priority Data

Dec. 16, 2009 (KR) .................... 10-2009-0125683

(51) Int. Cl.
   *H01L 29/04*  (2006.01)

(52) U.S. Cl.
   USPC .......... 257/59; 257/E51.018; 257/E51.022; 257/E51.005; 257/E29.151; 438/34; 438/149; 438/154

(58) Field of Classification Search
   USPC .......... 257/59, E51.018, E51.022, E51.005, 257/E29.151; 438/34, 149, 154, FOR. 201, 438/FOR. 184
   See application file for complete search history.

(56) References Cited

U.S. PATENT DOCUMENTS

| | | | |
|---|---|---|---|
| 8,093,586 B2 * | 1/2012 | Shimoji et al. | 257/40 |
| 2005/0285197 A1 * | 12/2005 | Park | 257/347 |
| 2007/0052022 A1 * | 3/2007 | Park et al. | 257/347 |
| 2009/0014721 A1 * | 1/2009 | Tanabe | 257/59 |
| 2010/0051910 A1 * | 3/2010 | Choi | 257/40 |
| 2010/0078631 A1 * | 4/2010 | Pieh | 257/40 |
| 2011/0198608 A1 * | 8/2011 | Yamanaka et al. | 257/72 |

FOREIGN PATENT DOCUMENTS

| | | |
|---|---|---|
| JP | 2008286905 | 11/2008 |
| KR | 2000-0003178 A | 1/2000 |
| KR | 1020010028643 | 4/2001 |
| KR | 2001-0088770 A | 9/2001 |
| KR | 2008-0076608 A | 8/2008 |
| KR | 2008-0082777 A | 9/2008 |

OTHER PUBLICATIONS

Korean Office Action dated May 16, 2011 in Korean Priority Application No. 10-2009-0125683.

* cited by examiner

*Primary Examiner* — Alexander Sofocleous
*Assistant Examiner* — Joannie A Garcia
(74) *Attorney, Agent, or Firm* — Knobbe Martens Olson & Bear LLP

(57) ABSTRACT

An organic light emitting display (OLED) device is disclosed. The OLED device includes a thin-film transistor (TFT), which includes a gate electrode; an active layer insulated from the gate electrode; source and drain electrodes insulated from the gate electrode and contacting the active layer; and an insulation layer interposed between the source and drain electrodes and the active layer; and an organic light-emitting element electrically connected to the TFT, wherein the insulation layer includes a first insulation sub-layer contacting the active layer; and a second insulation sub-layer formed on the first insulation sub-layer.

20 Claims, 4 Drawing Sheets

ORGANIC LIGHT-EMITTING DISPLAY AND METHOD OF MANUFACTURING THE SAME

CROSS-REFERENCE TO RELATED APPLICATIONS

This application claims the benefit of Korean Patent Application No. 10-2009-0125683, filed on Dec. 16, 2009, in the Korean Intellectual Property Office, the disclosure of which is incorporated herein in its entirety by reference.

BACKGROUND

1. Field

The field generally relates to an organic light-emitting display (OLED) device and a method of manufacturing the same, and more particularly, to an OLED device including a thin-film transistor (TFT) and a method of manufacturing the OLED device.

2. Description of the Related Technology

Each pixel of an active matrix organic light-emitting display (AMOLED) device includes a thin-film transistor (TFT) and an organic light-emitting element.

An active layer of the TFT has been formed using amorphous silicon or poly-silicon. Some active layers have been formed using an oxide semiconductor.

Characteristics of oxide semiconductors, such as a threshold voltage and S-factor, are prone to variation when exposed to moisture or oxygen permeating from outside the organic light-emitting device. The oxide semiconductor threshold voltage is prone to further variation due to the DC bias of a gate electrode during the operation of a TFT. Therefore, the stability of the DC bias becomes an important factor when using an oxide semiconductor for forming the active layer of a TFT in an organic light-emitting display device.

Some devices have applied a film formed of $AlO_x$ or TiN to the substrate, in order to strengthen the barrier characteristics of the oxide semiconductor with respect to moisture or oxygen. However, such films are generally formed by reactive sputtering or active layer deposition (ALD), and are thus difficult to apply large substrates. This difficulty affects the ability to mass-produce TFTs.

SUMMARY OF CERTAIN INVENTIVE ASPECTS

The present disclosure provides an organic light emitting display (OLED) device capable of blocking moisture or oxygen from outside, and a method of manufacturing such a device. The OLED device disclosed may easily be applied to a large-sized display device.

One aspect is an organic light-emitting display (OLED) device including: a thin-film transistor (TFT) including: a gate electrode, an active layer insulated from the gate electrode, source and drain electrodes insulated from the gate electrode and contacting the active layer, and an insulation layer electrically insulating the active later from the source and drain electrodes and further insulating the active layer from the source and an organic light-emitting element electrically connected to the TFT, where the insulation layer includes: a first insulation sub-layer contacting the active layer, and a second insulation sub-layer formed on the first insulation sub-layer and contacting the source and drain electrodes.

Another aspect is a method of manufacturing an organic light-emitting display (OLED) device, the method including: forming a gate electrode partially on a substrate, forming a gate insulation layer on the substrate to cover the gate electrode, forming an active layer partially on the gate insulation layer, forming an insulation layer covering at least a channel region of the active layer, where the insulation layer includes a first insulation sub-layer on the active layer and a second insulation sub-layer on the first insulation sub-layer, forming source and drain electrodes on the second insulation sub-layer, where the source and drain electrodes contact the active layer through the insulation layer, and forming an organic light-emitting element electrically connected to one of the source and drain electrodes.

Another aspect is an organic light-emitting display device including: a substrate, an organic light-emitting element, and a thin-film transistor (TFT) electrically connected to the organic light-emitting element, the TFT including: a gate electrode, an active layer, a source electrode contacting the active layer, a drain electrode contacting the active layer, and an insulation layer interposed between the source electrode and the active layer and further interposed between the drain electrode and the active layer, the insulation layer including: a first insulation sub-layer formed on the active layer, and a second insulation sub-layer formed on the first insulation sub-layer, where the second insulation sub-layer has a higher density than the first insulation sub-layer.

According to an aspect of the present invention, there is provided an organic light-emitting display (OLED) device including a thin-film transistor (TFT), which includes a gate electrode; an active layer insulated from the gate electrode; source and drain electrodes insulated from the gate electrode and contacting the active layer; and an insulation layer interposed between the source and drain electrodes and the active layer, and an organic light-emitting element electrically connected to the TFT, wherein the insulation layer includes a first insulation layer contacting the active layer; and a second insulation layer formed on the first insulation layer.

The first insulation layer may include silicon oxide ($SiO_x$).

The first insulation layer may be formed at a temperature below 250° C.

The second insulation layer may include silicon oxide ($SiO_x$).

Here, the second insulation layer may be formed at a temperature above 300° C.

The second insulation layer may include at least one of silicon nitride ($SiN_x$), a metal oxide, and a metal nitride.

Here, the metal oxide and the metal nitride may include aluminum oxide, aluminum nitride, titanium oxide, or titanium nitride.

The second insulation layer may be formed to have a relative high density as compared to the first insulation layer.

The second insulation layer may be formed at a relatively high temperature as compared to that of the first insulation layer.

The active layer may include an oxide semiconductor.

According to another aspect of the present invention, there is provided a method of manufacturing an organic light-emitting display (OLED) device, the method including forming a gate electrode partially on a substrate; forming a gate insulation layer on the substrate to cover the gate electrode; forming an active layer partially on the gate insulation layer; forming an insulation layer covering at least a channel region of the active layer; forming source and drain electrodes, which contact the active layer, on the insulation layer; and forming an organic light-emitting element electrically connected to one of the source and drain electrodes, wherein the forming the insulation layer includes forming a first insulation layer covering at least the channel region of the active layer; and forming a second insulation layer covering the first insulation layer.

The step of forming the first insulation layer may include forming silicon oxide ($SiO_x$) on the active layer at a temperature below 250° C.

The step of forming the second insulation layer may include forming silicon oxide ($SiO_x$) on the first insulation layer at a temperature above 300° C.

The second insulation layer may include at least one of silicon nitride ($SiN_x$), a metal oxide, and a metal nitride.

The metal oxide and the metal nitride may include aluminum oxide, aluminum nitride, titanium oxide, or titanium nitride.

The second insulation layer may be formed to have a relative high density as compared to that of the first insulation layer.

The second insulation layer may be formed at a relatively high temperature as compared to that of the first insulation layer.

The active layer may include an oxide semiconductor.

DETAILED DESCRIPTION OF CERTAIN INVENTIVE EMBODIMENTS

Figure 1:
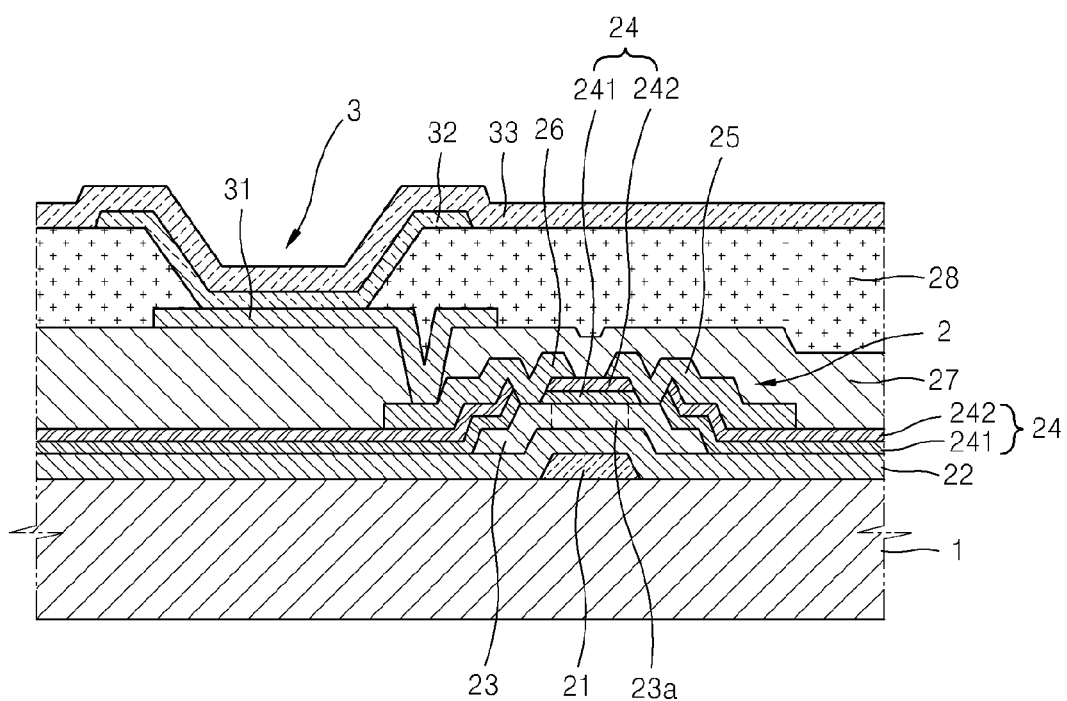
FIG. 1 is a sectional view of an organic light-emitting display (OLED) device according to an embodiment of the present invention.

FIG. 1 is a sectional view of an organic light-emitting display (OLED) device according to an embodiment of the present invention.

Referring to FIG. 1, a thin-film transistor (TFT) 2 and an organic light-emitting element 3 are disposed on a substrate 1. In the embodiment of FIG. 1, a single pixel of the OLED device is shown, but the OLED device includes a plurality of such pixels.

The TFT 2 includes a gate electrode 21 formed on the substrate 1, a gate insulation layer 22 formed on the substrate, covering the gate electrode 21, an active layer 23 formed on the gate insulation layer 22, an insulation layer 24 formed on the gate insulation layer 22 covering the active layer 23, and a source electrode 25 and a drain electrode 26 formed on the insulation layer 24, contacting the active layer 23. The embodiment shown in FIG. 1 represents a bottom gate type TFT 2. Other embodiments may include a top gate type TFT.

A buffer layer (not shown), which is formed of an inorganic material (e.g. a silicon oxide), may additionally be formed on the substrate 1.

The gate electrode 21, which is formed on the substrate 1, is formed of a conductive metal, and may include a single layer or multiple layers. In one embodiment, the gate electrode 21 may include molybdenum.

In some embodiments, the gate insulation layer 22 may be formed of silicon oxide, tantalum oxide, or aluminum oxide and the like. Other materials may be used in other embodiments.

The patterned active layer 23 is formed on the gate insulation layer 22. The active layer 23 may be formed of an oxide semiconductor. In some embodiments, the active layer may include oxygen, and one or more elements selected from a group consisting of gallium (Ga), indium (In), zinc (Zn), tin (Sn), and hafnium (Hf). For example, in some embodiments, the active layer 23 may include one or more materials such as ZnO, ZnGaO, ZnInO, GaInO, GaSnO, ZnSnO, InSnO, HfIn-ZnO, or ZnGaInO. In one embodiment, the active layer may include gallium-indium-zinc-oxide (GIZO). The GIZO may be comprised of $a(In_2O_3).b(Ga_2O_3).c(ZnO)$ wherein a, b, and c are predetermined constants that satisfy the conditions $a \geq 1$, $b \geq 1$, and $c \geq 1$.

The insulation layer 24 is formed to cover the active layer 23. The insulation layer 24 protects the channel region 23a of the active layer 23. In the embodiment shown in FIG. 1, the insulation layer 24 may be formed to cover the entire active layer 23, except for portions where the source and drain electrodes 25 and 26 contact the active layer 23. In other embodiments, the insulation layer 24 may be formed only on the channel region 23a. In some embodiments, the insulation layer 24 is formed of two sub-layers; a first insulation sub-layer 241 and a second insulation sub-layer 242. Detailed descriptions of these sub-layers are provided below.

Referring back to FIG. 1, the source electrode 25 and the drain electrode 26 are formed on the insulation layer 24, and contact the active layer 23. A passivation layer 27 is formed on the insulation layer 24, covering the source electrode 25 and the drain electrode 26, and a first electrode 31 of the OLED 3, which contacts the drain electrode 26, is formed on the passivation layer 27. A pixel-defining layer (PDL) 28, partially exposing the first electrode 31, is formed on the passivation layer 27, and an organic layer 32 and a second electrode 33 are formed on the PDL 28. The top surface of the first electrode 31 is exposed by the PDL 28.

The PDL 28 is formed to cover ends of the first electrode 31. The PDL 28 defines a light emitting region, and widens the gap between the first electrode 31 and the second electrode 33 in a direction toward the edges of the first electrode 31. This prevents short circuits between the first electrode 31 and the second electrode 33, because the concentration of electric fields at the edges of the first electrode 31 is reduced.

The first electrode 31 is patterned for each pixel. In front emission type organic light emitting display embodiments, in which an image is formed toward the second electrode 33, the first electrode 31 may be a reflective electrode. To this end, a reflective layer formed of an alloy of Al, Ag, or the like may be used to form the first electrode.

In embodiments where the first electrode 31 is used as an anode electrode, the first electrode 31 may include a layer formed of a metal oxide with a high work function, such as ITO, IZO, and ZnO. In embodiments where the first electrode 31 is used as a cathode electrode, the first electrode 31 may include a highly electro-conductive material, such as Ag, Mg, Al, Pt, Pd, Au, Ni, Nd, Ir, Cr, Li, or Ca, with a low work function. In such embodiments, a reflective layer is not necessary.

The second electrode 33 may be a phototransmissive electrode. The second electrode 33 may include a semi-transmissive reflective layer, which is a thin-film including Ag, Mg, Al, Pt, Pd, Au, Ni, Nd, Ir, Cr, Li, or Ca, or may include a phototransmissive metal oxide, such as ITO, IZO, and ZnO. In some embodiments, the first electrode 31 is used as an anode, and the second electrode 33 is used as a cathode. In other embodiments, the first electrode 31 is used as a cathode, and the second electrode 33 is used as an anode. The organic layer 32 interposed between the first electrode 31 and the second electrode 33 includes a light emitting layer, and may include a hole injection transporting layer, and an electron injection transporting layer.

A protective layer (not shown) may additionally be formed on the second electrode 33, and in some embodiments, the pixel may be sealed by using glass, for example.

An embodiment of the insulation layer 24 of the OLED device is described below.

Characteristics of an active layer formed of an oxide semiconductor, including threshold voltage and S-factor, are prone to variation when exposed to moisture or oxygen permeating from outside the OLED device. The oxide semiconductor threshold voltage is prone to further variation due to the DC bias of the gate electrode during the operation of a TFT. Therefore, the stability of the DC bias becomes an important factor when using an oxide semiconductor for forming the active layer of a TFT in an organic light-emitting display device. In order to prevent oxygen and moisture to reach the active layer, and to protect the active layer from plasma damage, it is possible to include an insulation layer during the manufacturing of the device. Such an insulation layer should not deteriorate the characteristics of the active layer, and thus the insulation layer should be formed at a relatively low temperature. However, when an insulation layer is formed at a relatively low temperature, the characteristics of the insulation layer are deteriorated, and thus the reliability of the active layer is also deteriorated.

According to an embodiment of the present invention, the insulation layer 24 includes two sub-layers, the first insulation sub-layer 241 and the second insulation sub-layer 242, each sub-layer with different characteristics.

In one embodiment, the insulation layer 24 includes the first insulation sub-layer 241, contacting the active layer 23, and the second insulation sub-layer 242, formed on and contacting the first insulation sub-layer 241. The first insulation sub-layer 241 is formed to prevent or minimize plasma damage to the active layer 23. The second insulation sub-layer 242 is formed to provide a barrier against moisture and oxygen to the active layer 23.

In some embodiments, the first insulation sub-layer 241 may be an oxide layer, such as a $SiO_x$ layer, formed by using methods, such as PECVD or sputtering, at a relatively low temperature (e.g. below 250° C.). The oxide layer may include a material of which density and concentration are relatively low.

In some embodiments, the second insulation sub-layer 242 may be formed of a $SiN_x$, a metal oxide, or a metal nitride, and may include aluminum oxide, aluminum nitride, titanium oxide, or titanium nitride. In other embodiments, the second insulation sub-layer 242 may include an oxide layer, such as a $SiO_x$ layer, formed by using methods, such as PECVD or sputtering, at a relatively high temperature (e.g. 300° C.), and the second insulation sub-layer 242 may include a material of which density and concentration are relatively high.

In some embodiments, the second insulation sub-layer 242 may be formed of a material of which density and concentration are higher than those of the material of the first insulation sub-layer 241. The second insulation sub-layer 242 may be formed at a higher temperature than the temperature used in forming the first insulation sub-layer 241. When an insulation layer is formed at a low temperature, e.g. below 250° C., the characteristics of the active layer 23 are improved, but the reliability of the TFT is deteriorated. When an insulation layer is formed at a high temperature, e.g. above 300° C., the reliability of the active layer 23 is improved, but the characteristics of the active layer 23 are deteriorated. In one embodiment, in forming the two insulation sub-layers 241 and 242, the characteristics of the active layer 23 may be improved by forming the first insulation sub-layer 241 directly contacting the active layer 23 of the TFT 2 at a relatively low temperature, and the reliability of the active layer 23 may be improved by forming the second insulation layer 24 at a relatively high temperature.

An insulation layer 24 having a stacked structure, such as in the embodiment described above, exhibits higher barrier characteristics with respect to the active layer 23 compared to a conventional insulation layer formed of a single layer of silicon oxide or silicon nitride. Such an insulation layer 24 provides sufficient protection to the active layer 23 against moisture and oxygen.

An embodiment of a method of fabricating an embodiment of the insulation layer 24 is described below.

FIGS. 2A through 2F are sectional views illustrating an embodiment of a method of manufacturing the insulation layer of the OLED device of FIG. 1.

Figure 2A:
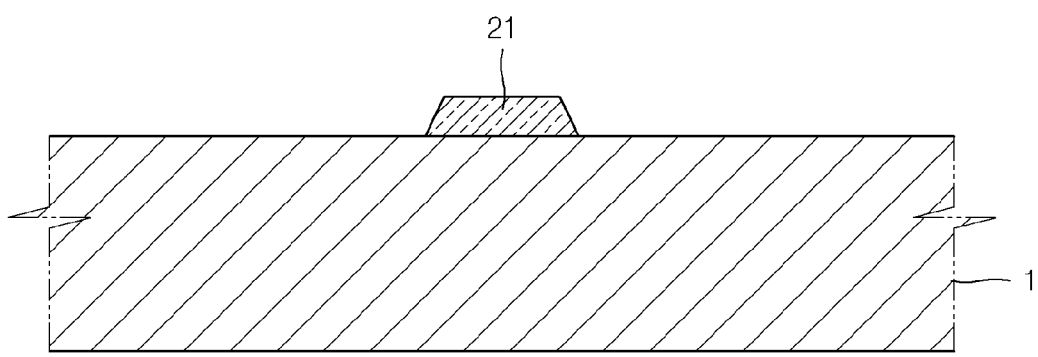
FIGS. 2A through 2F are sectional views illustrating an embodiment of a method of manufacturing the insulation layer of the OLED device of FIG. 1.

Referring to FIG. 2A, the substrate 1 is prepared. The substrate 1 may be formed of silicon (Si), glass, or an organic material. In embodiments using a silicon (Si) substrate, an insulation layer (not shown) may be formed on a surface of the silicon (Si) substrate through thermal oxidization. Next, the gate electrode 21 is formed by applying a conductive material, such as a metal or an electro-conductive metal oxide, on a surface of the substrate 1 and patterning the applied material.

Figure 2B:
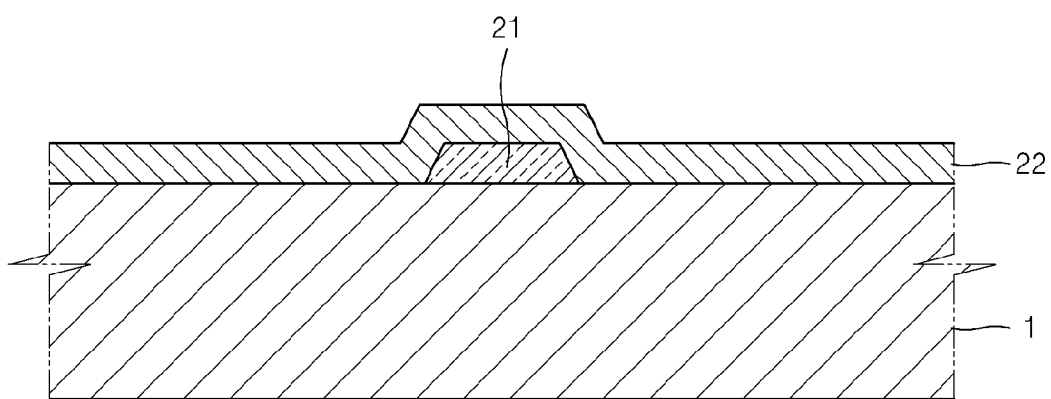

Next, referring to FIG. 2B, the gate insulation layer 22 is formed by applying an insulation material on the top surface of the gate electrode 21 and the substrate 1 and patterning the applied material.

Figure 2C:
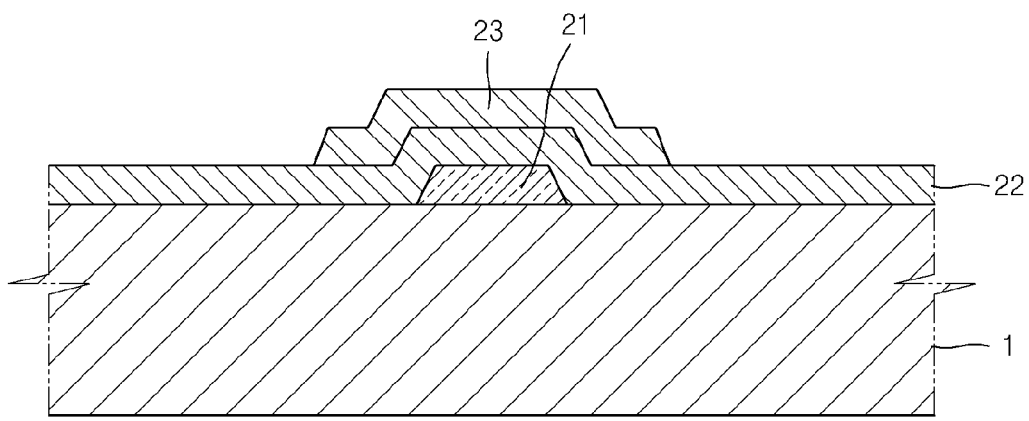

Next, referring to FIG. 2C, the active layer 23 is formed by applying a semiconductor material on the gate insulation layer 22 by using a method such as PVD, CVD, or ALD, and patterning the applied material. In some embodiments, the semiconductor material may be a gallium-indium-zinc-oxide (GIZO) layer. The GIZO layer may be comprised of the layer $a(In_2O_3).b(Ga_2O_3).c(ZnO)$ wherein a, b, and c are predetermined constants that satisfy the conditions $a \geq 1$, $b \geq 1$, and $c \geq 1$. In one embodiment, the semiconductor material may include a HfInZnO layer.

Figure 2D:
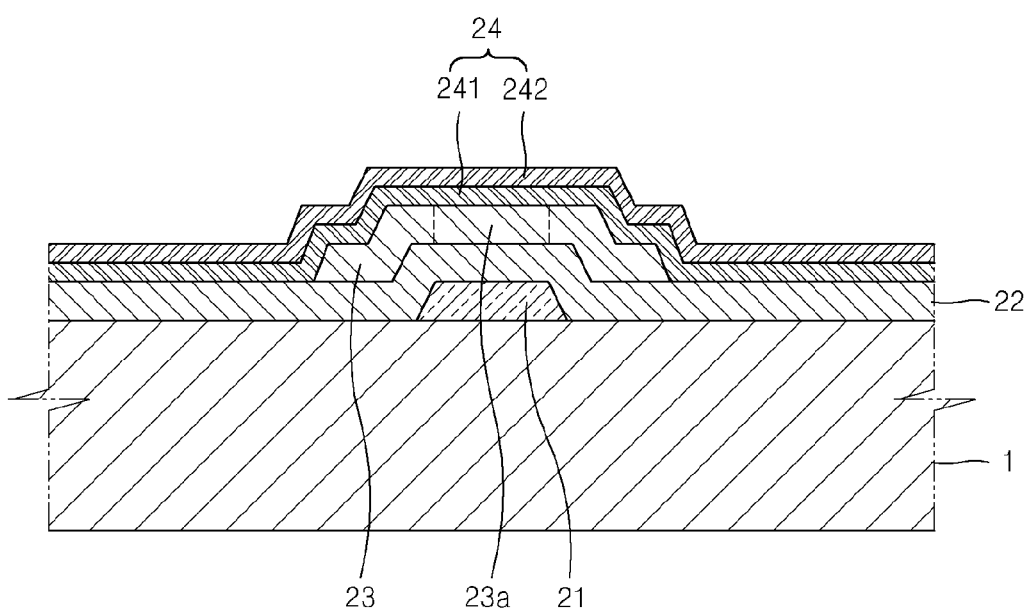

Next, referring to FIG. 2D, the first insulation sub-layer 241 and the second insulation sub-layer 242 are sequentially formed to cover the active layer 23 and the gate insulation layer 22.

The first insulation sub-layer 241 is formed to cover the patterned active layer 23. The first insulation sub-layer 241 is formed of silicon oxide by using a method, such as PECVD or sputtering. The first insulation sub-layer 241 is formed to prevent or minimize damage to the active layer 23 during formation of the first insulation sub-layer 241. In some embodiments, the first insulation sub-layer 241 may be an oxide layer, such as a $SiO_x$ layer, formed by using a method, such as PECVD or sputtering, at a relatively low temperature (e.g. below 250° C.). The oxide layer may be formed of a material of which density and concentration are relatively low.

Next, the second insulation sub-layer 242 is formed on the first insulation sub-layer 241. The second insulation sub-layer 242 is formed to provide protection to the active layer 23 against moisture and oxygen. In some embodiments, the second insulation sub-layer 242 may be formed of a $SiN_x$, a metal oxide, or a metal nitride. The second insulation sub-layer 242 including a metal oxide or a metal nitride may be formed by forming a metal layer and either forming a metal oxide by performing a thermal-process on the metal layer in an oxygen atmosphere or forming a metal nitride by performing a $N_2$ plasma process on the metal layer. In other embodiments, the second insulation sub-layer 242 may be an oxide layer, such as a $SiO_x$ layer, formed by using methods, such as PECVD or sputtering, at a relatively high temperature (e.g. 300° C.). The second insulation sub-layer 242 may be formed of a material of which density and concentration are higher than the material of the first insulation sub-layer 241. The second insulation sub-layer 242 may be formed at a higher temperature than that used to form the first insulation sub-layer 241.

Figure 2E:
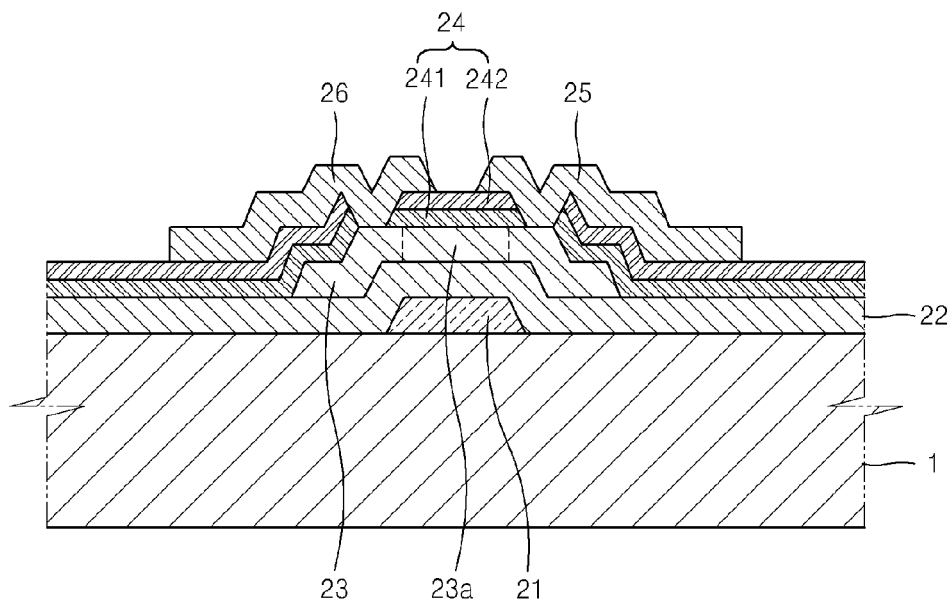

Next, referring to FIG. 2E, the source electrode 25 and the drain electrode 26 are formed by forming holes in the insulation layer 24, applying a material, such as a metal or an electro-conductive metal oxide, to the insulation layer 24, and patterning the applied material to form the source electrode 25 and the drain electrode 26, which contact the active layer 23 through the holes.

Figure 2F:
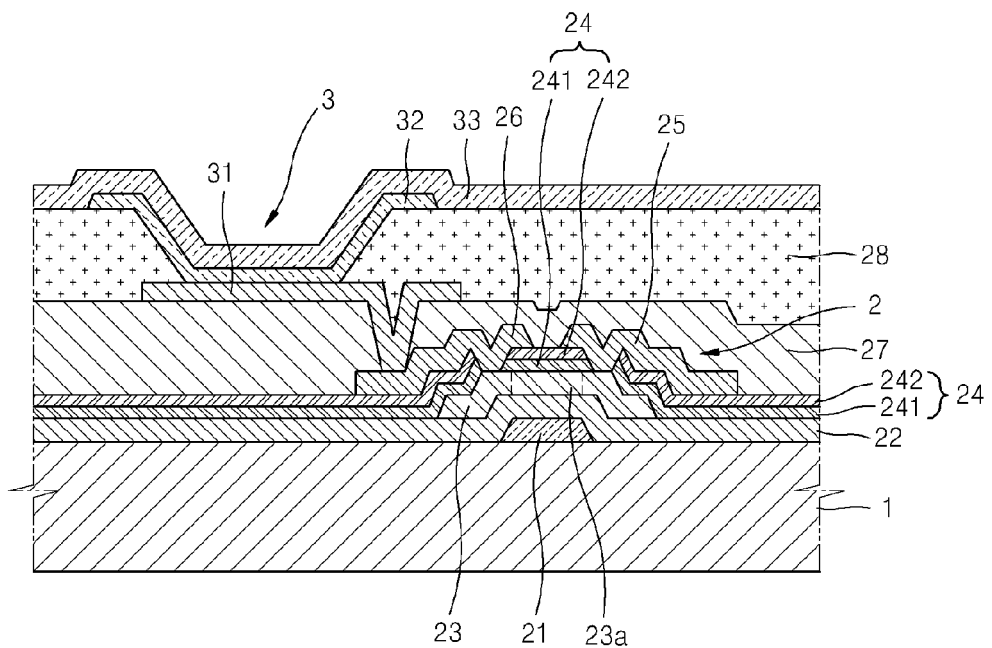

Finally, as shown in FIG. 2F, the passivation layer 27 is formed to cover the source electrode 25 and the drain electrode 26, and the first electrode 31 of the organic light-emitting element 3, which contacts the drain electrode 26, is formed on the passivation layer 27. Then, the PDL 28 exposing a portion of the first electrode 31 is formed on the passivation layer 27, and the organic layer 32 and the second electrode 33 are formed on the top surface of the exposed portion of the first electrode 31. Accordingly, an embodiment of the OLED device as shown in FIG. 1 is manufactured.

While this disclosure has been described in connection with certain exemplary embodiments, it will be understood by those of ordinary skill in the art that various changes in form and details may be made without departing from the spirit and scope of the present invention.

What is claimed is:

1. An organic light-emitting display (OLED) device comprising:
    a substrate;
    a thin-film transistor (TFT) comprising:
        a gate electrode formed over the substrate;
        a gate insulation layer formed on the gate electrode;
        an active layer formed over the gate insulation layer and insulated from the gate electrode by the gate insulation layer;
        an insulation layer formed between the active layer and the source electrode, and further formed between the active layer and the drain electrode;
        source and drain electrodes insulated from the gate electrode and contacting the active layer; and
        wherein the insulation layer electrically insulates the active layer from the source and drain electrodes, and comprises a first insulation sub-layer contacting at least a portion of the active layer; and a second insulation sub-layer formed on the first insulation sub-layer and contacting the source and drain electrodes; and
    an organic light-emitting element formed over the TFT and electrically connected to the TFT.

2. The OLED device of claim 1, wherein the first insulation sub-layer comprises silicon oxide ($SiO_x$).

3. The OLED device of claim 2, wherein the first insulation sub-layer is formed at temperatures below 250° C.

4. The OLED device of claim 1, wherein the second insulation sub-layer comprises silicon oxide ($SiO_x$).

5. The OLED device of claim 4, wherein the second insulation sub-layer is formed at temperatures above 300° C.

6. The OLED device of claim 1, wherein the second insulation sub-layer comprises at least one of silicon nitride ($SiN_x$), a metal oxide, and a metal nitride.

7. The OLED device of claim 6, wherein the metal oxide and the metal nitride comprise at least one of aluminum oxide, aluminum nitride, titanium oxide, and titanium nitride.

8. The OLED device of claim 1, wherein the second insulation sub-layer is formed to have a higher density than the first insulation sub-layer.

9. The OLED device of claim 1, wherein the second insulation sub-layer is formed at a higher temperature than the first insulation sub-layer.

10. The OLED device of claim 1, wherein the active layer comprises an oxide semiconductor.

11. A method of manufacturing an organic light-emitting display (OLED) device, the method comprising:
    forming a gate electrode partially on a substrate;
    forming a gate insulation layer on the gate electrode;
    forming an active layer on at least part of the gate insulation layer;
    forming an insulation layer over at least a portion of the active layer, wherein the insulation layer comprises a first insulation sub-layer contacting the active layer and a second insulation sub-layer contacting the first insulation sub-layer;
    forming source and drain electrodes on the second insulation sub-layer, wherein the source and drain electrodes contact the active layer; and
    forming an organic light-emitting element electrically connected to one of the source and drain electrodes, wherein the organic light-emitting element is formed over the gate electrode, the gate insulation layer, the active layer, the insulation layer and the source and drain electrodes.

12. The method of claim 11, wherein the forming the first insulation sub-layer comprises forming silicon oxide ($SiO_x$) on the active layer at a temperature below 250° C.

13. The method of claim 11, wherein the forming the second insulation sub-layer comprises forming silicon oxide ($SiO_x$) on the first insulation sub-layer at a temperature above 300° C.

14. The method of claim 11, wherein the second insulation sub-layer comprises at least one of silicon nitride ($SiN_x$), a metal oxide, and a metal nitride.

15. The method of claim 14, wherein the metal oxide and the metal nitride comprise at least one of aluminum oxide, aluminum nitride, titanium oxide, and titanium nitride.

16. The method of claim 11, wherein the second insulation sub-layer is formed to have higher density than the first insulation sub-layer.

17. The method of claim 11, wherein the second insulation sub-layer is formed at a higher temperature than the first insulation sub-layer.

18. The method of claim 11, wherein the active layer comprises an oxide semiconductor.

19. An organic light-emitting display device comprising:
    a substrate;
    an organic light-emitting element; and
    a thin-film transistor (TFT) formed between the substrate and the organic light-emitting element, and electrically connected to the organic light-emitting element, the TFT comprising:
        a gate electrode formed over the substrate,
        a gate insulation layer formed over the gate electrode,
        an active layer formed over the gate insulation layer and insulated from the gate electrode by the gate insulation layer,
        a source electrode contacting the active layer;
        a drain electrode contacting the active layer; and
        an insulation layer formed over the gate insulation layer and interposed between the source electrode and the active layer and further interposed between the drain electrode and the active layer; the insulation layer comprising:
            a first insulation sub-layer formed contacting the active layer; and a second insulation sub-layer contacting the first insulation sub-layer, wherein the second insulation sub-layer has a higher density than the first insulation sub-layer.

20. The organic light-emitting display (OLED) device of claim 19, wherein the second insulation sub-layer is formed at a higher temperature than the first insulation sub-layer.

* * * * *